United States Patent
Aoki

(10) Patent No.: US 7,697,582 B2
(45) Date of Patent: Apr. 13, 2010

(54) LASER DRIVING CIRCUIT

(75) Inventor: Takashi Aoki, Urayasu (JP)

(73) Assignee: Canon Kabushiki Kaisha, Tokyo (JP)

( * ) Notice: Subject to any disclaimer, the term of this patent is extended or adjusted under 35 U.S.C. 154(b) by 186 days.

(21) Appl. No.: 11/908,496

(22) PCT Filed: May 24, 2006

(86) PCT No.: PCT/JP2006/310823

§ 371 (c)(1),
(2), (4) Date: Sep. 12, 2007

(87) PCT Pub. No.: WO2006/129684

PCT Pub. Date: Dec. 7, 2006

(65) Prior Publication Data

US 2009/0052485 A1    Feb. 26, 2009

(30) Foreign Application Priority Data

Jun. 1, 2005   (JP)  ............................... 2005-161416
May 22, 2006  (JP)  ............................... 2006-142163

(51) Int. Cl.
*H01S 3/00* (2006.01)

(52) U.S. Cl. ................. 372/38.02; 372/38.07; 372/38.1

(58) Field of Classification Search ................ 372/38.1, 372/38.01–38.09
See application file for complete search history.

(56) References Cited

U.S. PATENT DOCUMENTS 5,500,867 A *  3/1996  Krasulick ................ 372/38.02
5,598,040 A    1/1997  Markis
5,764,667 A    6/1998  Luque

FOREIGN PATENT DOCUMENTS

| JP | 63-044782 A | 2/1988 |
| JP | 11-233876 A | 8/1999 |
| JP | 11-284267 A | 10/1999 |

(Continued)

OTHER PUBLICATIONS

Search Report dated Sep. 10, 2009 in corresponding European Patent Application No. 06756771.9.

*Primary Examiner*—Minsun Harvey
*Assistant Examiner*—Xnning Niu
(74) *Attorney, Agent, or Firm*—Fitzpatrick, Cella, Harper & Scinto

(57) ABSTRACT

A purpose of this invention is to suppress radiation noise while satisfying demands for higher speeds and higher image qualities of a semiconductor laser driving device in a laser beam printer or the like. A laser driving circuit includes a first wiring pattern and a second wiring pattern which are connected to a main wiring pattern, a first circuit which is connected to the first wiring pattern and has a semiconductor laser element (7) and a laser driving device for driving the semiconductor laser element, a second circuit which is connected to the second wiring pattern, has a compensation element and a compensation driving device, and compensates for noise in the first circuit, and a common mode choke coil which is connected to the first and second wiring patterns and selectively increases impedances to in-phase signal components in a signal flowing through the first wiring pattern and the first circuit and a signal flowing through the second wiring pattern and the second circuit.

4 Claims, 12 Drawing Sheets

FOREIGN PATENT DOCUMENTS

| | | |
|---|---|---|
| JP | 2000-166254 A | 6/2000 |
| JP | 2002-124732 A | 4/2002 |
| JP | 2004-165448 A | 6/2004 |
| JP | 2004-349406 A | 12/2004 |
| JP | 2005-073403 A | 3/2005 |
| WO | 02/089273 A2 | 11/2002 |

* cited by examiner $t = 35$ [μm]
$h = 1.0$ [mm]
$\varepsilon_r = 4.3$
$\sigma = 5.8 \times 10^7$ [S/mm]

FIG. 3

| NUMBER | WIDTH [mm] | LENGTH [mm] |
|---|---|---|
| 2 | 2.0 | 30 |
| 4a | 0.7 | 7 |
| 4b | 0.7 | 10 |
| 5a | 0.7 | 4 |
| 5b | 0.7 | 8 |
| 8 | 0.15 | 1 |
| 12 | 0.15 | 1 |

LASER DRIVING CIRCUIT

TECHNICAL FIELD

The present invention relates to a laser driving circuit for a printed circuit board which supports a driving device for a semiconductor laser used as the printing light source of an image forming apparatus.

BACKGROUND ART

At present, image forming apparatuses are demanded of higher printing speeds and higher image qualities of printed images. For this purpose, a semiconductor laser driving device in a laser beam printer or the like must increase the driving frequency of the semiconductor laser element and increase the number of semiconductor laser elements.

In general, the laser driving circuit is made up of a semiconductor laser element which forms a light-emitting circuit, a laser driving semiconductor device, a wiring which connects the semiconductor laser element and laser driving semiconductor device, a main power transmission wiring, a main GND (ground) wiring, a wiring which connects the main power transmission wiring and light-emitting circuit, and a wiring which connects the main GND wiring and light-emitting circuit. The light-emitting circuit supplies a current of about several ten mA at a frequency of about 10 MHz to the semiconductor laser element, flickers the semiconductor laser, and thereby converts a received electrical data signal into an optical data signal.

However, if a large high-frequency current flows through the semiconductor laser driving circuit, a noise component is generated in a current flowing through the light-emitting circuit. That is, a noise component such as ringing is generated in the light-emitting circuit due to the impedances of the semiconductor laser element, laser driving semiconductor device, main power transmission wiring, main GND wiring, and remaining wirings. The generated noise component propagates as a noise current to the main power transmission wiring and main GND wiring. The noise current degrades the quality of the emission current of the semiconductor laser element, and decreases the precisions of the emission timing and emission amount, obstructing the demand for higher image qualities. When the power cable shares GND (ground) with another signal cable or the like, the noise current may also flow into the signal cable.

When the laser driving semiconductor device supplies/stops a high-frequency current, the amount of current flowing through the main power transmission wiring varies. In response to this, the power supply voltage varies, generating radiation noise. In addition, the voltage level of the main power supply instantaneously varies due to the above-mentioned noise component such as ringing, generating larger radiation noise. These problems of radiation noise become more serious when the main wiring is connected to a power cable. Large radiation noise is radiated from the power cable functioning as an antenna source.

As a method of solving these problems, Japanese Patent Laid-Open No. 63-044782 discloses a method of arranging a filter on a wiring which connects a semiconductor laser element and laser driving semiconductor device. However, as the driving frequency increases, degradation of the emission current waveform by the filter itself stands out. It is very difficult to simultaneously satisfy increases in speed and image quality and reduction of radiation noise.

Recently, a compensation circuit is generally added as a method of suppressing a noise component. FIG. 12 shows an example of a laser driving circuit to which the compensation circuit is added.

A compensation circuit 10 made up of a compensation element 11, wiring 12, and compensation semiconductor device 13 is parallel from a main power transmission wiring 2 with a light-emitting circuit 6 made up of a semiconductor laser element 7, wiring 8, and laser driving semiconductor device 9. The compensation circuit 10 is driven complementarily with the light-emitting circuit 6, and implements a compensation function using a current from a feed capacitor 1 as a constant current. Since a current flowing through the main power transmission wiring 2 is a constant current, variations in power on the main wiring can be suppressed.

Ringing generated in the compensation circuit 10 is opposite in phase to ringing generated in the light-emitting circuit 6. At a branch point 3 between a first wiring 4 and a second wiring 5, ringing of a current flowing through the light-emitting circuit 6 is canceled by ringing of a current flowing through the compensation circuit 10. As a result, generation of ringing can be suppressed, and the quality of the emission current of the semiconductor laser element in the light-emitting circuit 6 can be increased to implement higher-precision emission.

However, in the laser driving circuit shown in FIG. 12, the light-emitting circuit 6 and compensation circuit 10 must exhibit the same electrical characteristic. In other words, if the electrical characteristics of the light-emitting circuit 6 and compensation circuit 10 even slightly deviate from each other, noise components (e.g., ringing) which should be canceled are adversely added to generate a larger noise component. To prevent this, an impedance Z4 of the wiring 4 and an impedance Z5 of the wiring 5 must be designed equally. Alternatively, the wirings 4 and 5 are designed as short as possible to decrease the values of the wiring impedances Z4 and Z5 to 0 as much as possible.

However, the position of the semiconductor laser element is determined preferentially to the position of an optical system for processing a laser beam output from the semiconductor laser element. Since the degree of freedom of the wiring is greatly limited due to the demand for higher image qualities, it is very difficult to arbitrarily design the lengths of the wirings 4 and 5 and the like.

These days, the number of semiconductor laser elements, which is conventionally one or two for each color, is increasing to four owing to the demand for higher image qualities. The numbers of components and wirings arranged on the laser circuit board greatly increase. On the other hand, the optical axis of the laser beam is stabilized by fixing the laser circuit board to a surrounding metal housing. If the board size is increased for a higher degree of freedom of the wiring, the vibration resistance decreases, and the laser circuit board tends to shake along the optical axis, failing to meet the demand for higher image qualities.

Since the semiconductor laser element 7 and compensation element 11 are not formed from completely identical components, an impedance Z6 of the light-emitting circuit 6 and an impedance Z10 of the compensation circuit 10 have slightly different values. The impedance difference is not problematic at a driving frequency of about 10 MHz, but poses a serious problem at present because higher speeds up to about 60 MHz are demanded. For this reason, the laser driving circuit shown in FIG. 12 cannot satisfactorily meet the demand for higher driving frequencies.

DISCLOSURE OF INVENTION

The present invention has been made to overcome the conventional drawbacks, and has as its object to suppress radiation noise while satisfying demands for higher speeds and higher image qualities of a semiconductor laser driving device in a laser beam printer or the like.

To solve the above problems and achieve the above object, a laser driving circuit according to the present invention is characterized by comprising a first wiring pattern and a second wiring pattern which are connected to a main wiring pattern, a first circuit which is connected to the first wiring pattern and has a semiconductor laser element and a driving device for driving the semiconductor laser element, a second circuit which is connected to the second wiring pattern and has a compensation element and a compensation driving device, and impedance control means, connected to the first wiring pattern and the second wiring pattern, for selectively increasing impedances to in-phase signal components in a signal flowing through the first wiring pattern and the first circuit and a signal flowing through the second wiring pattern and the second circuit.

Other objects and advantages besides those discussed above shall be apparent to those skilled in the art from the description of a preferred embodiment of the invention which follows. In the description, reference is made to accompanying drawings, which form a part hereof, and which illustrate an example of the invention. Such example, however, is not exhaustive of the various embodiments of the invention, and therefore reference is made to the claims which follow the description for determining the scope of the invention.

BRIEF DESCRIPTION OF DRAWINGS

FIG. 3 is a table showing the size of the wiring pattern in Experimental Example 1;

BEST MODE FOR CARRYING OUT THE INVENTION

Preferred embodiments of the present invention will be described in detail below with reference to the accompanying drawings.

First Embodiment

Figure 1:
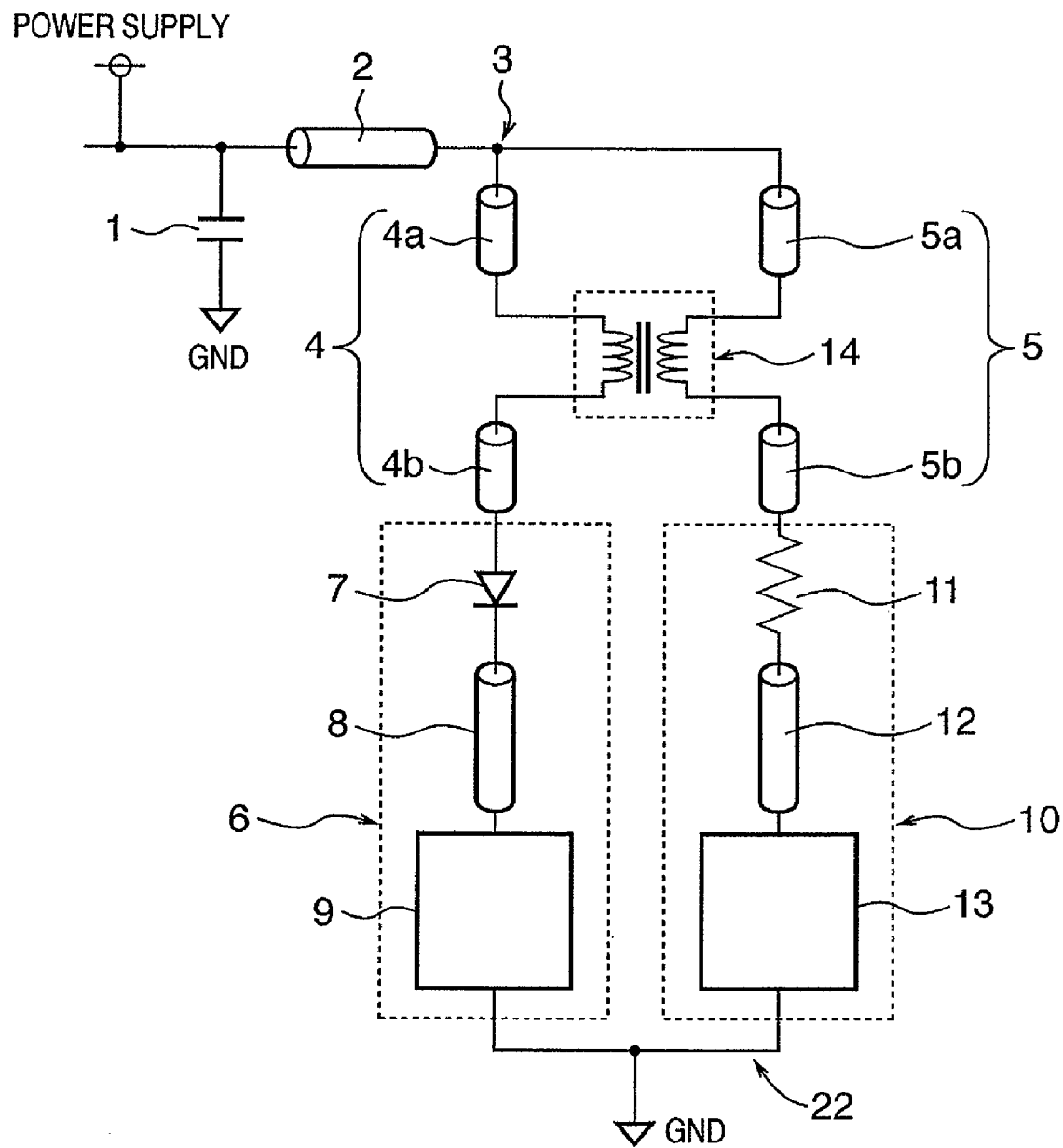
FIG. 1 is a circuit diagram showing a laser driving circuit according to the first embodiment of the present invention.

FIG. 1 is a circuit diagram showing the arrangement of the laser driving circuit of a printed circuit board which supports a semiconductor laser driving device according to the first embodiment of the present invention. In FIG. 1, the same reference numerals as those in FIG. 12 denote the same members.

In FIG. 1, reference numeral 1 denotes a feed capacitor; 2, a main power transmission wiring; 22, a main GND wiring; 4, a first wiring; and 5, a second wiring. The first and second wirings 4 and 5 are parallel at a branch point 3 of the main power transmission wiring 2. A common choke coil 14 is interposed between the first and second wirings 4 and 5. The first wiring 4 is divided by the common choke coil 14 into a third wiring 4a and fourth wiring 4b. The second wiring 5 is divided by the common choke coil 14 into a fifth wiring 5a and sixth wiring 5b.

Reference numeral 6 denotes a light-emitting circuit which is connected to the first wiring 4 and made up of a semiconductor laser element 7, seventh wiring 8, and laser driving semiconductor device 9. Reference numeral 10 denotes a compensation circuit which is connected to the second wiring 5 and made up of a compensation element 11, eighth wiring 12, and compensation semiconductor device 13. The light-emitting circuit 6 and compensation circuit 10 are also parallel, and connected to a ground wiring pattern. The compensation element 11 is configured to become identical in electrical characteristic to the semiconductor laser element 7 as much as possible. The wirings 8 and 12 use identical components, whereas the laser driving semiconductor device and compensation semiconductor device 13 use identical components. Note that FIG. 1 shows the wirings 2, 4, 5, 8, and 12 as if they were electric wires, but in practice, these wirings are formed from a conductor pattern on the printed board.

In FIG. 1, an emission current and compensation current complementarily flow through the wirings 4 and 5. Hence, only opposite-phase components ideally flow through the wirings 4 and 5. However, if a noise component such as ringing is generated, currents of in-phase components flow through the wirings 4 and 5. That is, opposite-phase components in the emission current and compensation current are associated with an emission operation, and in-phase components mean noise components.

The common choke coil 14 functions to decrease impedance values to opposite-phase components and increase those to in-phase components in an emission current flowing to the light-emitting circuit 6 and a compensation current flowing to the compensation circuit 10 from the branch point 3 between the light-emitting circuit 6 and the compensation circuit 10. The common mode choke coil 14 can selectively remove only a noise component. By removing a noise component such as ringing, the emission quality of the semiconductor laser element can be increased, voltage variations in the main power transmission wiring 2 can be suppressed, and thus generation of radiation noise can be suppressed.

Figure 9:
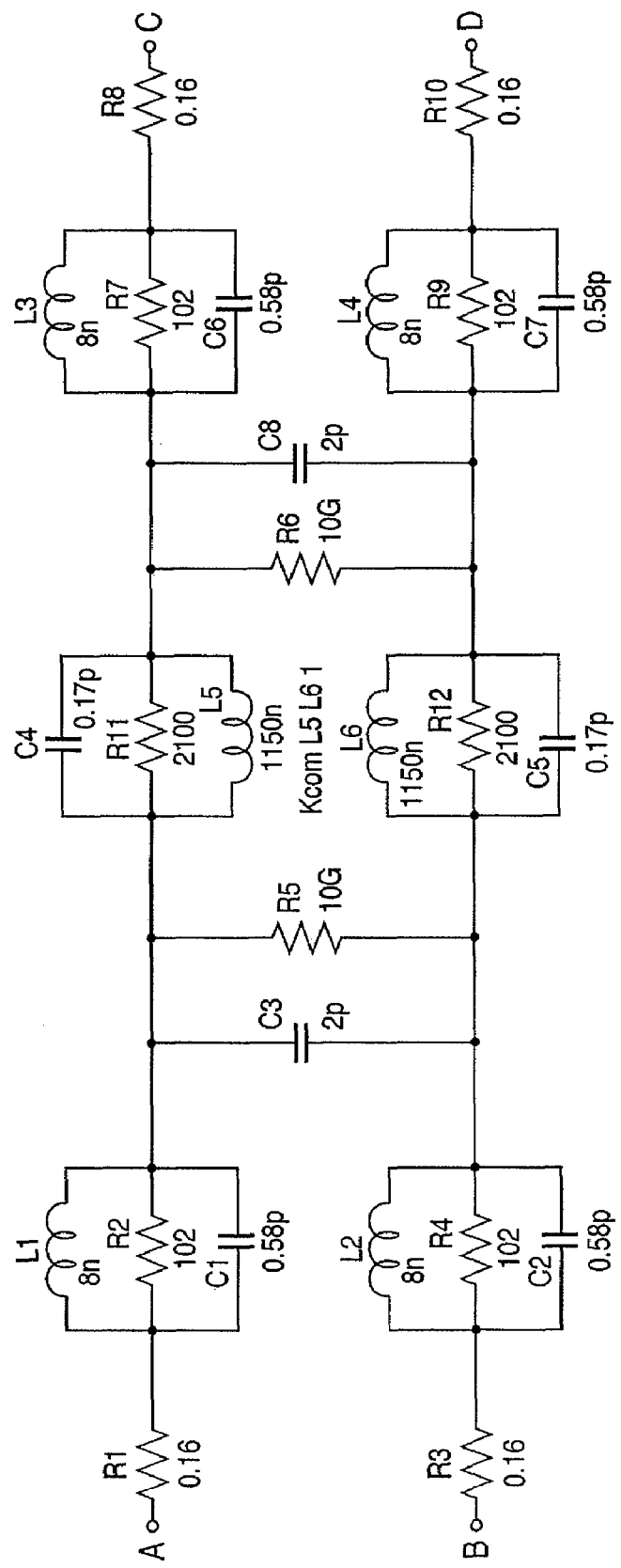
FIG. 9 is an equivalent circuit diagram showing the common mode choke coil.
Figure 10:
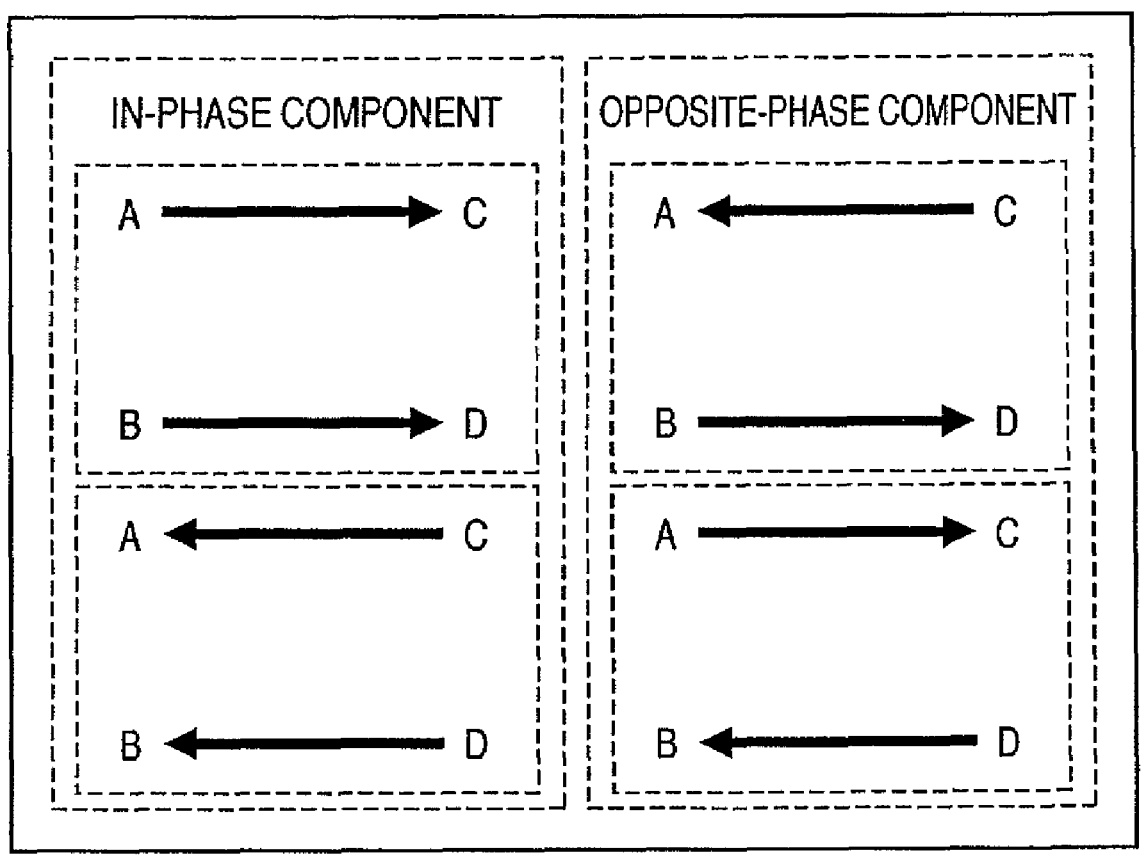
FIG. 10 is a conceptual view showing an in-phase component and opposite-phase component.

FIG. 9 is an equivalent circuit diagram showing the common mode choke coil. In FIG. 9, components flowing in the same direction in a current flowing from A to C and a current flowing from B to D are in-phase components, and components flowing in opposite directions are opposite-phase components. FIG. 10 is a conceptual view showing the in-phase component and opposite-phase component. In FIG. 10, a current flowing from A to C is assumed to be an emission current flowing from the main wiring 2 to the light-emitting circuit 6 in FIG. 1, and a current flowing from B to D is assumed to be a compensation current flowing from the main wiring 2 to the compensation circuit 10.

Since a coupling operation acts between the wirings 4 and 5 by the common choke coil 14, an impedance characteristic Zcommon to the in-phase component is several ten times larger than an impedance characteristic Zdifferential to the opposite-phase component. By using the common mode choke coil 14, only the in-phase component can be removed.

Experimental Example 1

Figure 2:
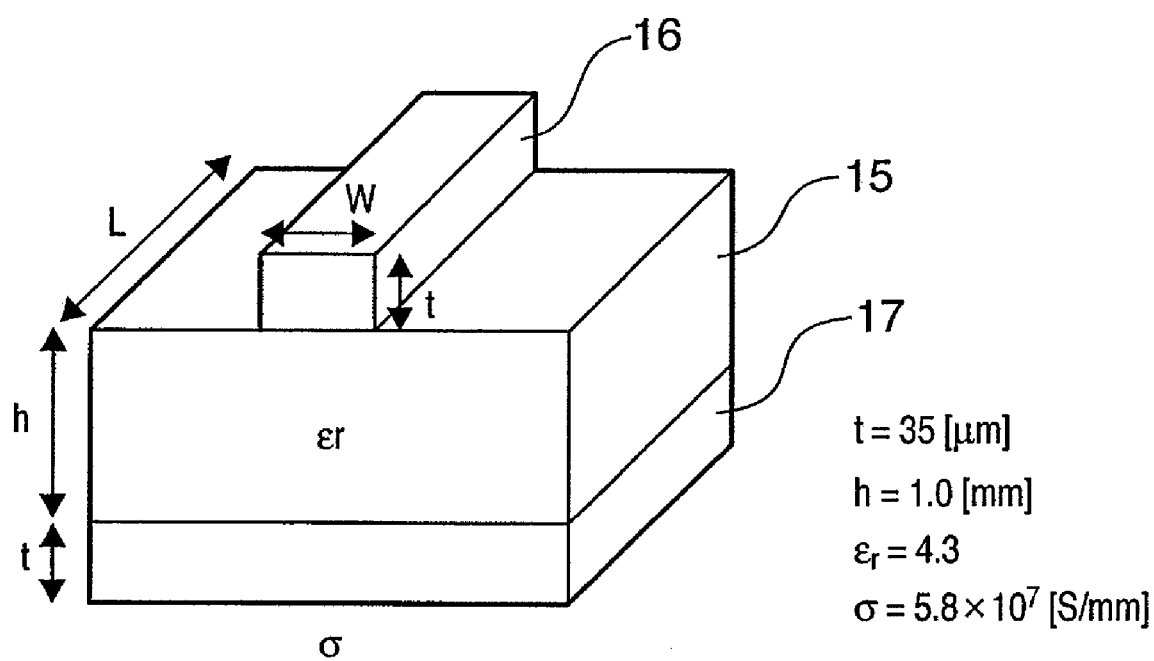
FIG. 2 is a sectional view showing a printed wiring board.

In order to explain the effects of the first embodiment, the laser driving circuit shown in FIG. 1 was simulated. The capacitance value of the feed capacitor 1 was 0.1 μF, the semiconductor laser element 7 was DL3038 (available from SANYO Electric) having a driving frequency of 20 MHz, the compensation element 11 was set to a resistance of 10Ω, the laser driving semiconductor element 9 and compensation semiconductor element 13 were M61881FP (available from Mitsubishi Electric), and the additionally arranged common mode choke coil 14 was ACM2520-601-2P (available from TDK). FIG. 2 shows the layout of the wirings 2, 4, 5, 8, and 12 which connect these components. In FIG. 2, reference numeral 15 denotes a board main body which is formed from an insulator; 16, a wiring pattern which is formed from a conductor arranged on the upper surface of the board main body 15; and 17, a conductor layer which is arranged on the lower surface of the board main body 15. FIG. 3 shows the wiring lengths of the wirings 2, 4, 5, 8, and 12. It is difficult to make the wiring lengths of the first and second wirings 4 and 5 equal to each other because the degree of freedom of the wiring is strictly limited in recent years.

Figure 4:
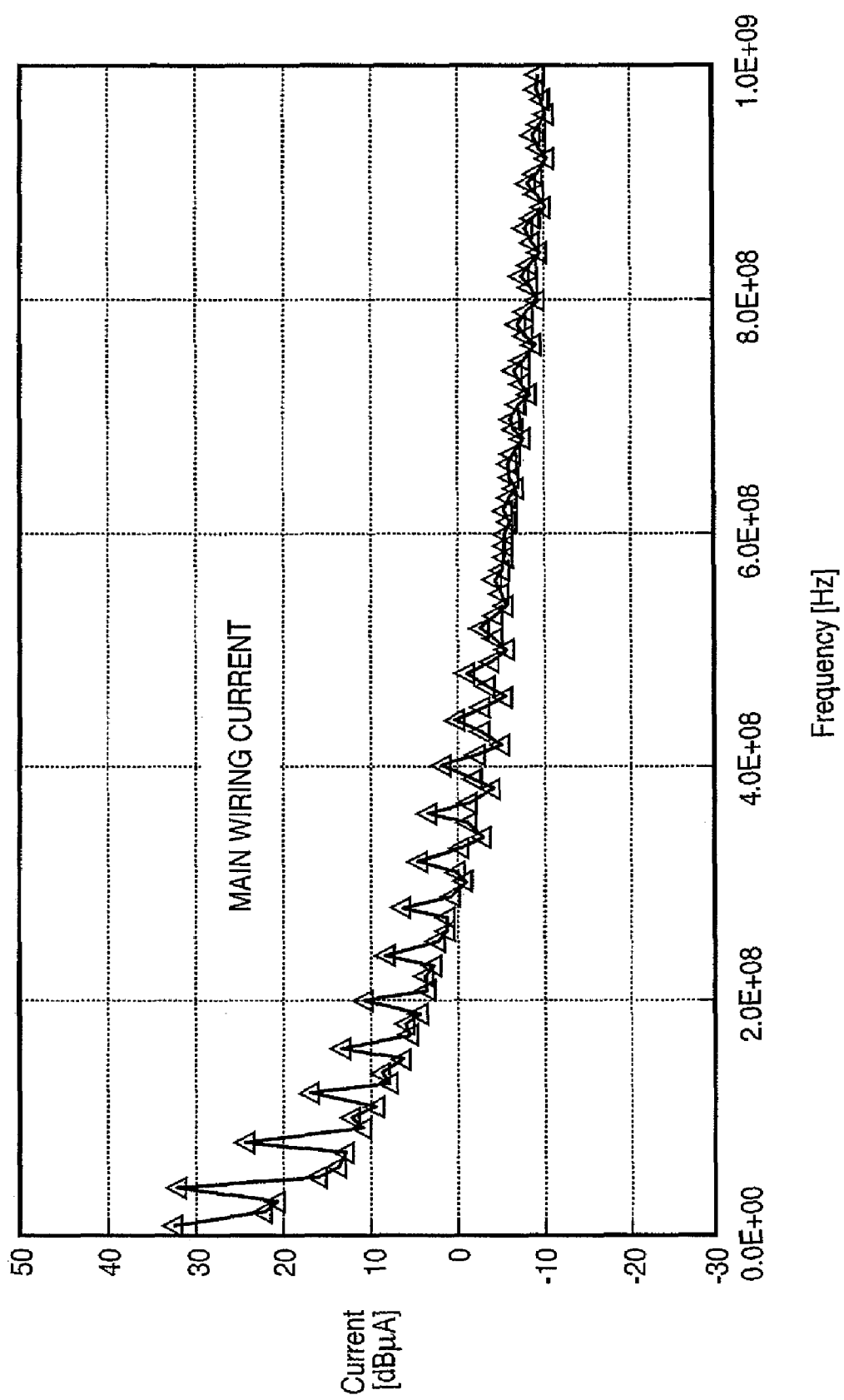
FIG. 4 is a timing chart showing the frequency characteristic of a main wiring current in Experimental Example 1.
Figure 5:
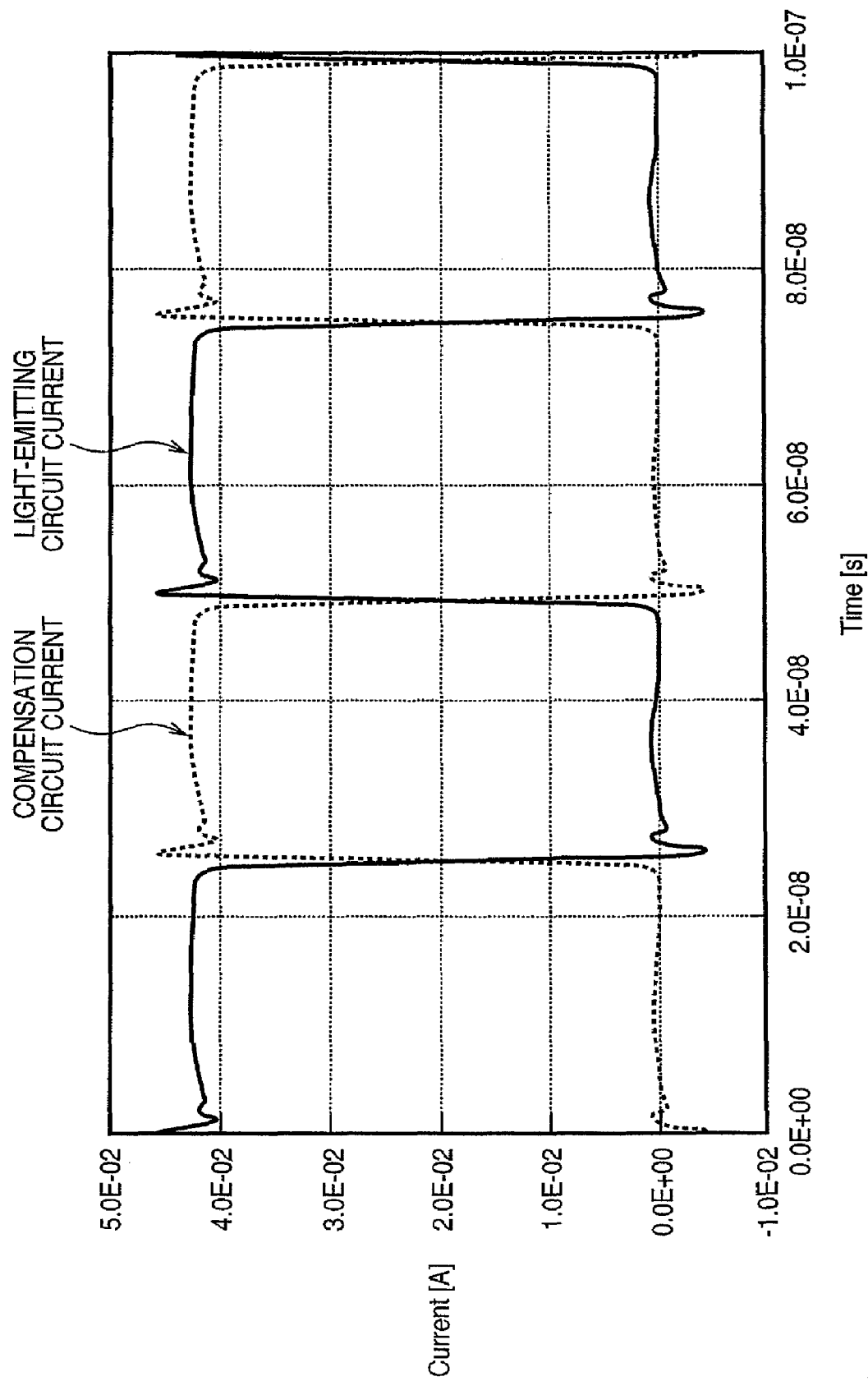
FIG. 5 is a graph showing changes over time in a light-emitting circuit current and compensation circuit current in Experimental Example 1.

FIGS. 4 and 5 show the results of simulating a current flowing through the main power transmission wiring 2 in this arrangement. FIG. 4 shows the frequency characteristic of a current flowing through the main power transmission wiring 2, and FIG. 5 shows changes over time in currents flowing through the light-emitting circuit 6 and compensation circuit 10.

Comparative Example 1

Figure 6:
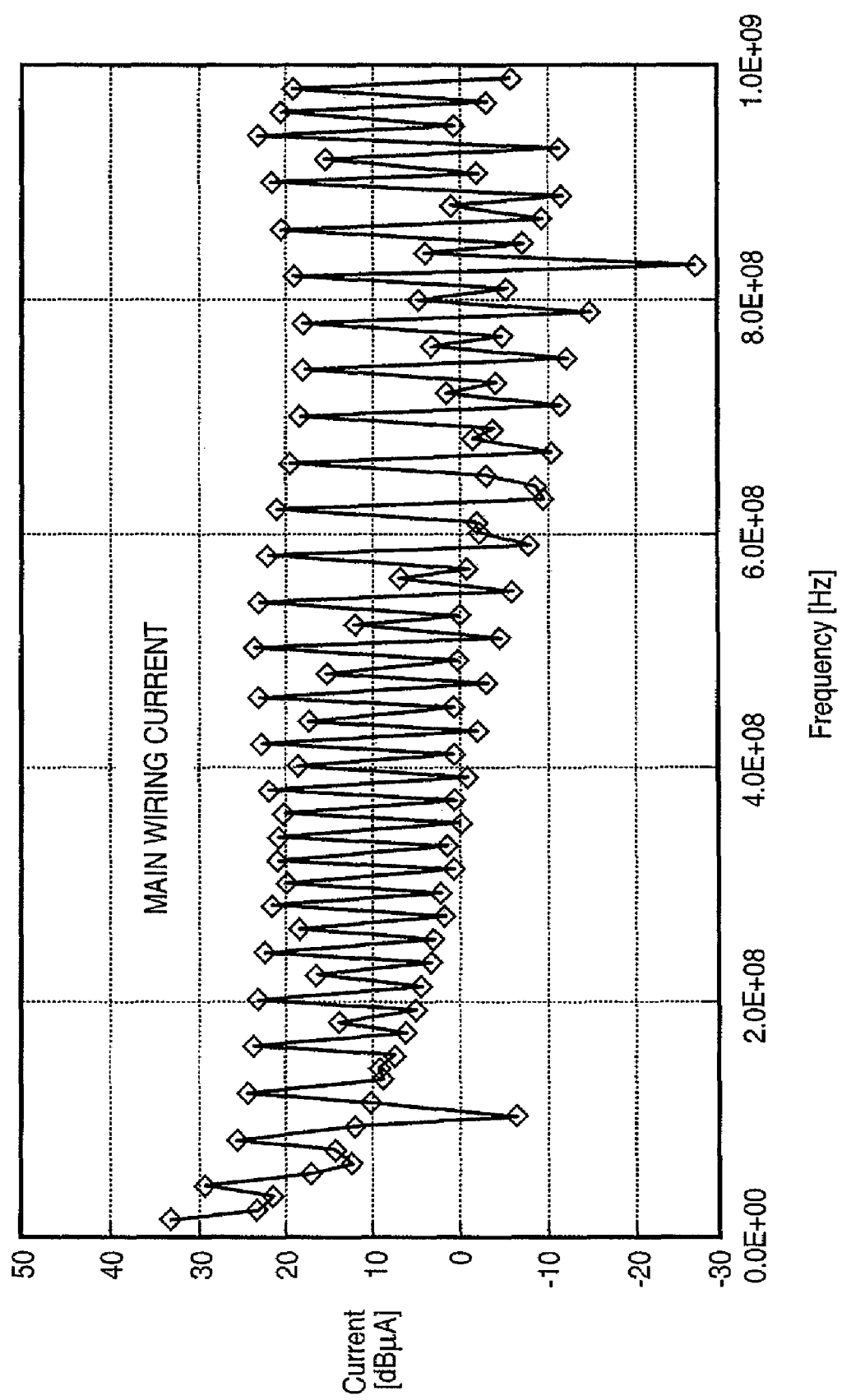
FIG. 6 is a graph showing the frequency characteristic of a main wiring current in Comparative Example 1.
Figure 7:
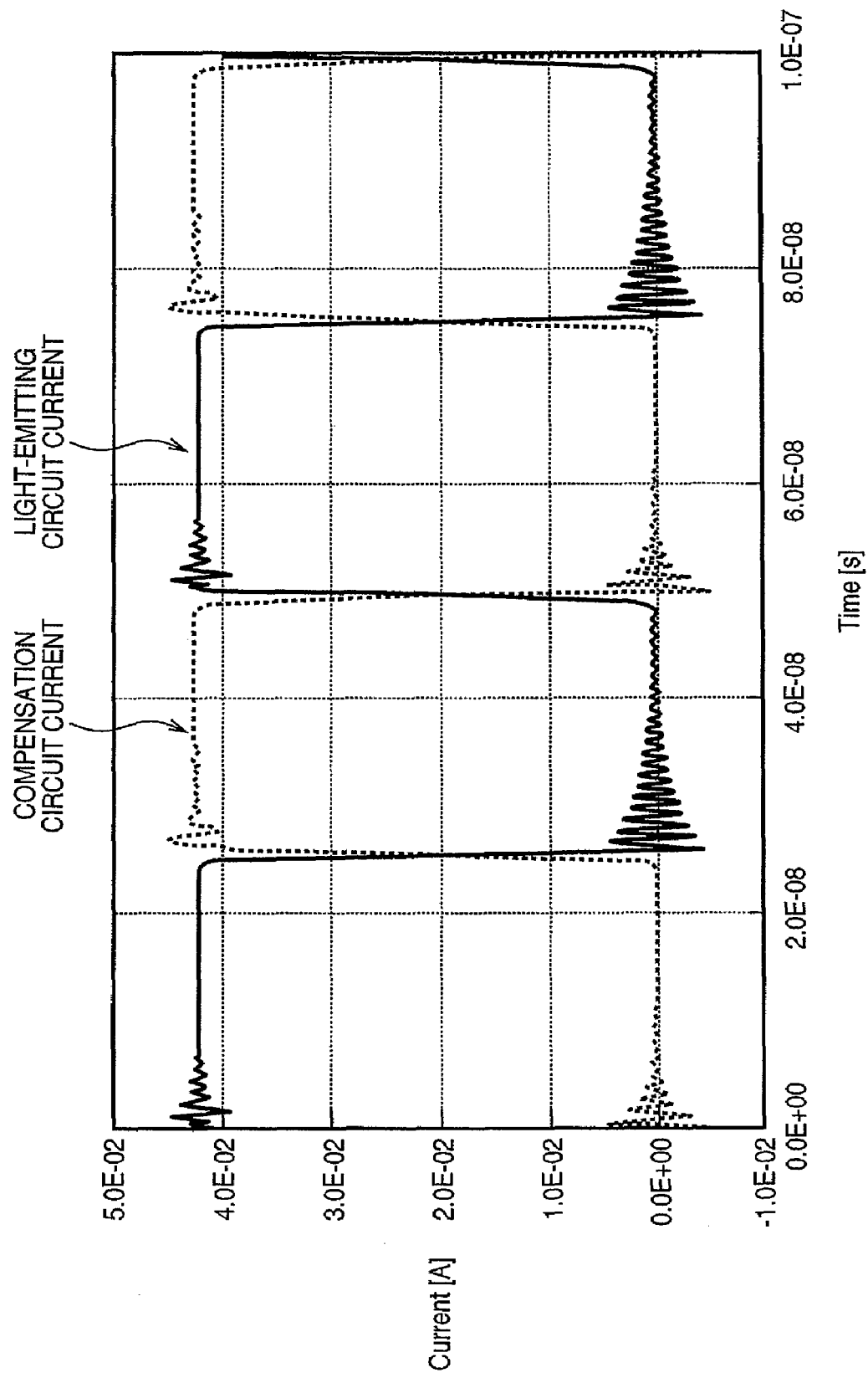
FIG. 7 is a timing chart showing changes over time in a light-emitting circuit current and compensation circuit current in Comparative Example 1.
Figure 12:
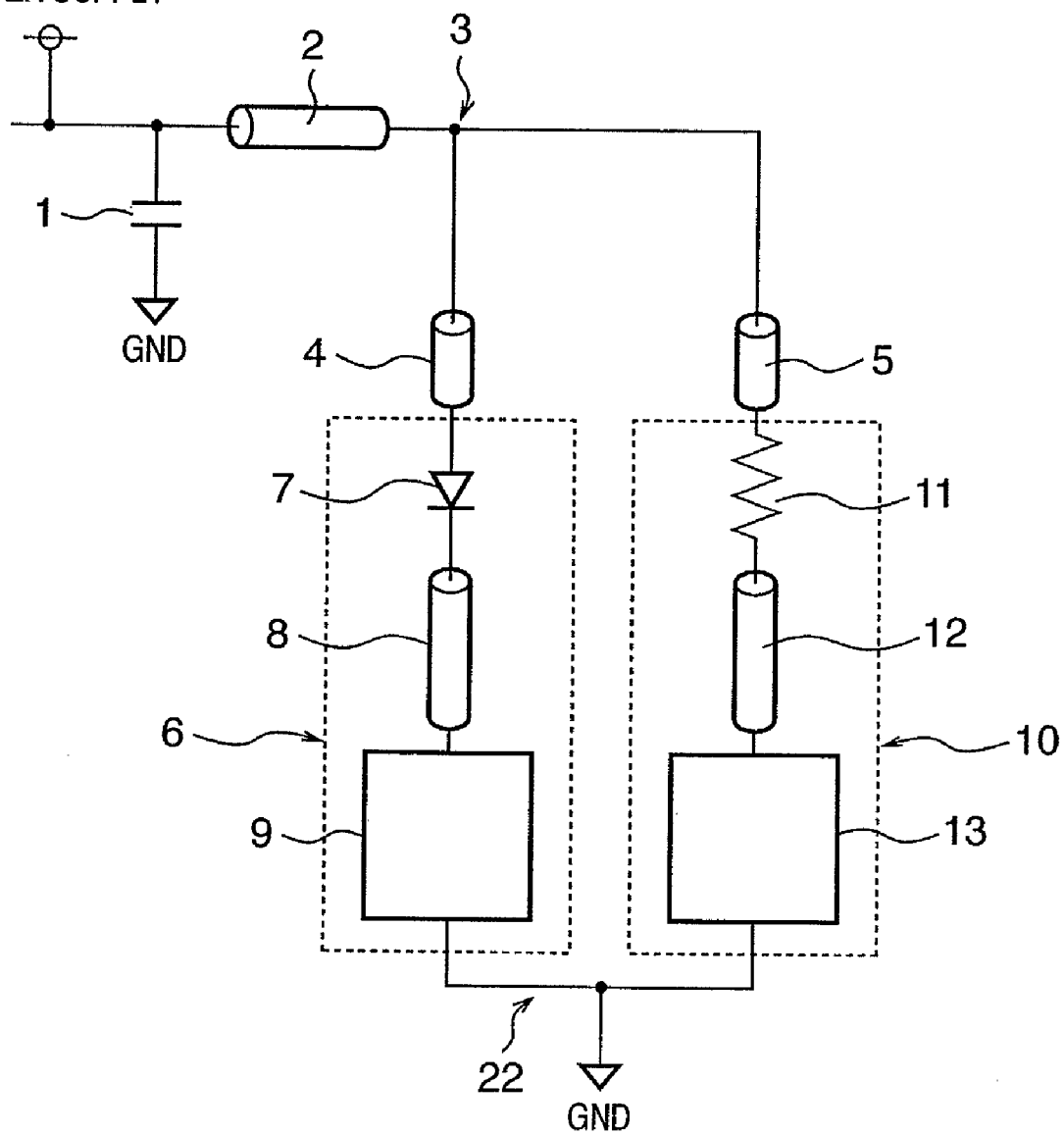
FIG. 12 is a circuit diagram showing a conventional laser driving circuit.

A current flowing through a main wiring in a conventional laser driving circuit shown in FIG. 12 was simulated for comparison, similar to Experimental Example 1. The simulation results are shown in FIGS. 6 and 7. FIG. 6 shows the frequency characteristic of a current flowing through the main power transmission wiring 2, and FIG. 7 shows changes over time in currents flowing through the light-emitting circuit 6 and compensation circuit 10. Note that the wiring lengths of wirings are equal to those in Experimental Example 1 shown in FIG. 3.

A comparison between FIGS. 4 and 6 exhibits that current variations at respective frequencies in FIG. 4 are much smaller than those in FIG. 6. A comparison between FIGS. 5 and 7 reveals that ringing of each signal in FIG. 5 is suppressed much more than that in FIG. 7. That is, in Experimental Example 1, compared to Comparative Example 1, the emission precision of the semiconductor laser element is kept high, and variations in main power supply are suppressed to greatly suppress radiation noise.

More specifically, in Comparative Example 1 shown in FIG. 12, a sum ZLaser of the impedance Z4 of the first wiring 4 and the impedance Z6 of the light-emitting circuit 6 is different from a sum ZComp of the impedance Z5 of the second wiring 5 and the impedance Z10 of the compensation circuit 10. In particular, the length (17 mm) of the first wiring 4 and that (12 mm) of the second wiring 5 are dominant. For this reason, even if the impedance Z6 of the light-emitting circuit 6 is equal to the impedance Z10 of the compensation circuit 10, the impedance sums ZLaser and ZComp become different from each other due to the difference between the lengths of the first and second wirings 4 and 5.

With this impedance difference, the compensation function of the compensation circuit 10 degrades, a noise component generated in the light-emitting circuit 6 cannot be canceled, and part of the noise component is added. The uncanceled noise component propagates to the main power transmission wiring 2 and main GND wiring 22, generating a noise component in a current flowing through the main power transmission wiring, as shown in FIG. 6. Note that it is apparent that, by making the wiring lengths of the first and second wirings 4 and 5 equal to each other, the compensation function of the compensation circuit 10 improves and a canceled noise current increase to reduce the noise current. However, as described above, it is difficult to make the wiring lengths of the first and second wirings 4 and 5 equal to each other.

Figure 8:
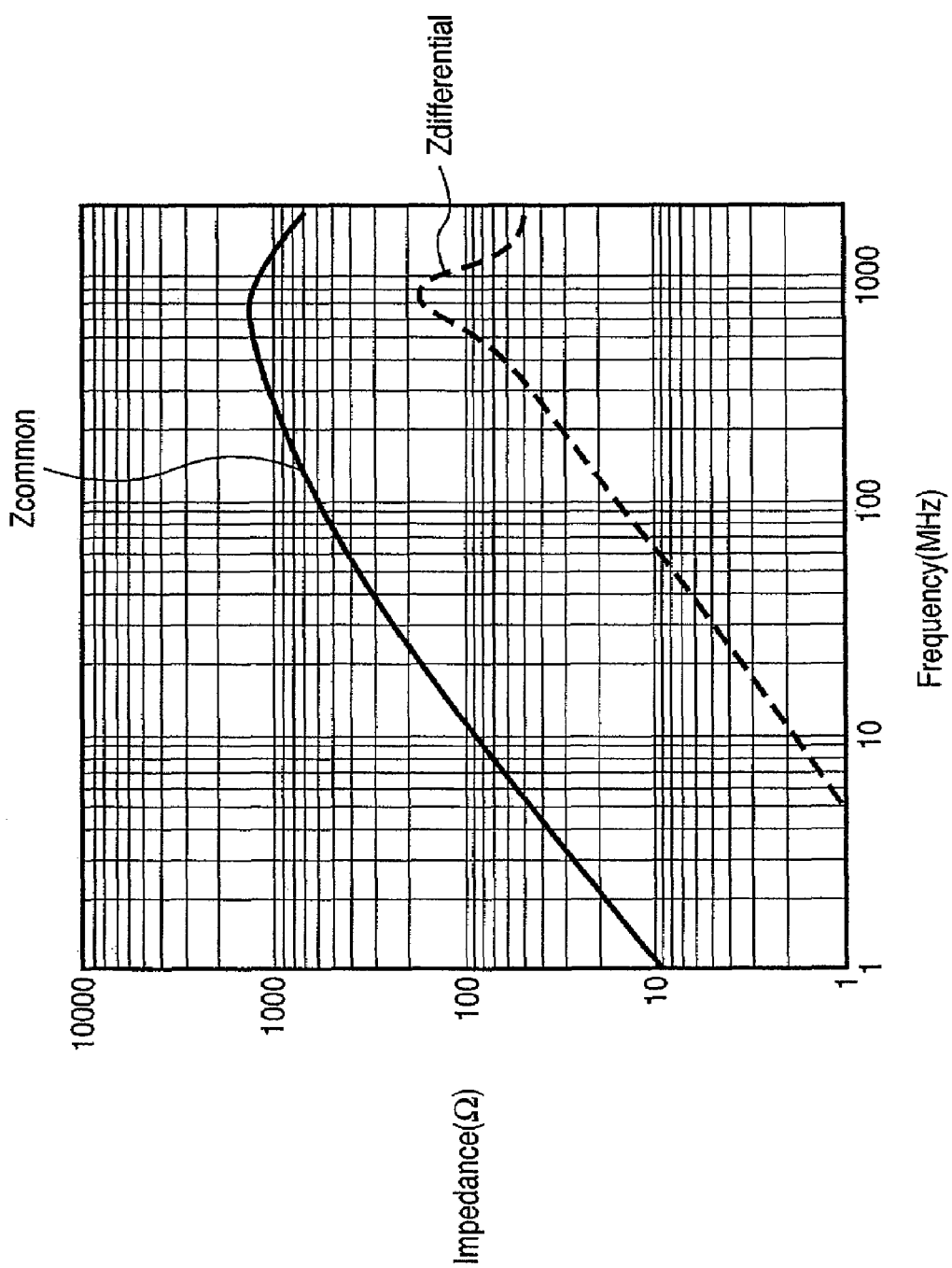
FIG. 8 is a graph showing the frequency characteristic of a common mode choke coil.

In the first embodiment shown in FIG. 1, the common mode choke coil 14 is arranged to decrease impedances to opposite-phase components and increase impedances to in-phase components in currents flowing through the wirings 4 and 5. FIG. 8 shows the results of simulating impedances at respective frequencies to a current flowing from the main power transmission wiring 2 to the light-emitting circuit 6 and a current flowing to the compensation circuit 10. Zdifferential represents an impedance to the opposite-phase component, and Zcommon represents an impedance to the in-phase component.

As is apparent from FIG. 8, the impedance Zcommon to the in-phase component is much higher than the impedance Zdifferential to the opposite-phase component. Hence, only in-phase components can be selectively removed at high precision from currents flowing from the main power transmission wiring 2 to the light-emitting circuit 6 and compensation circuit 10, suppressing a noise component such as ringing.

In the laser driving circuit shown in FIG. 1, the same effect of the common choke coil 14 can be obtained regardless of the arrangement position of the common choke coil 14 as far as it is interposed between the wirings 4 and 5. In other words, for example, the wirings 4a and 4b or the wirings 4b and 5b need neither be made equal to each other, nor satisfy a predetermined relationship. Even if the degree of freedom of the wiring is strictly limited due to the demand for higher image qualities, the arrangement of the embodiment can be easily formed.

As described above, the first embodiment can simultaneously achieve increases in speed and image quality and reduction of radiation noise.

Second Embodiment

Figure 11:
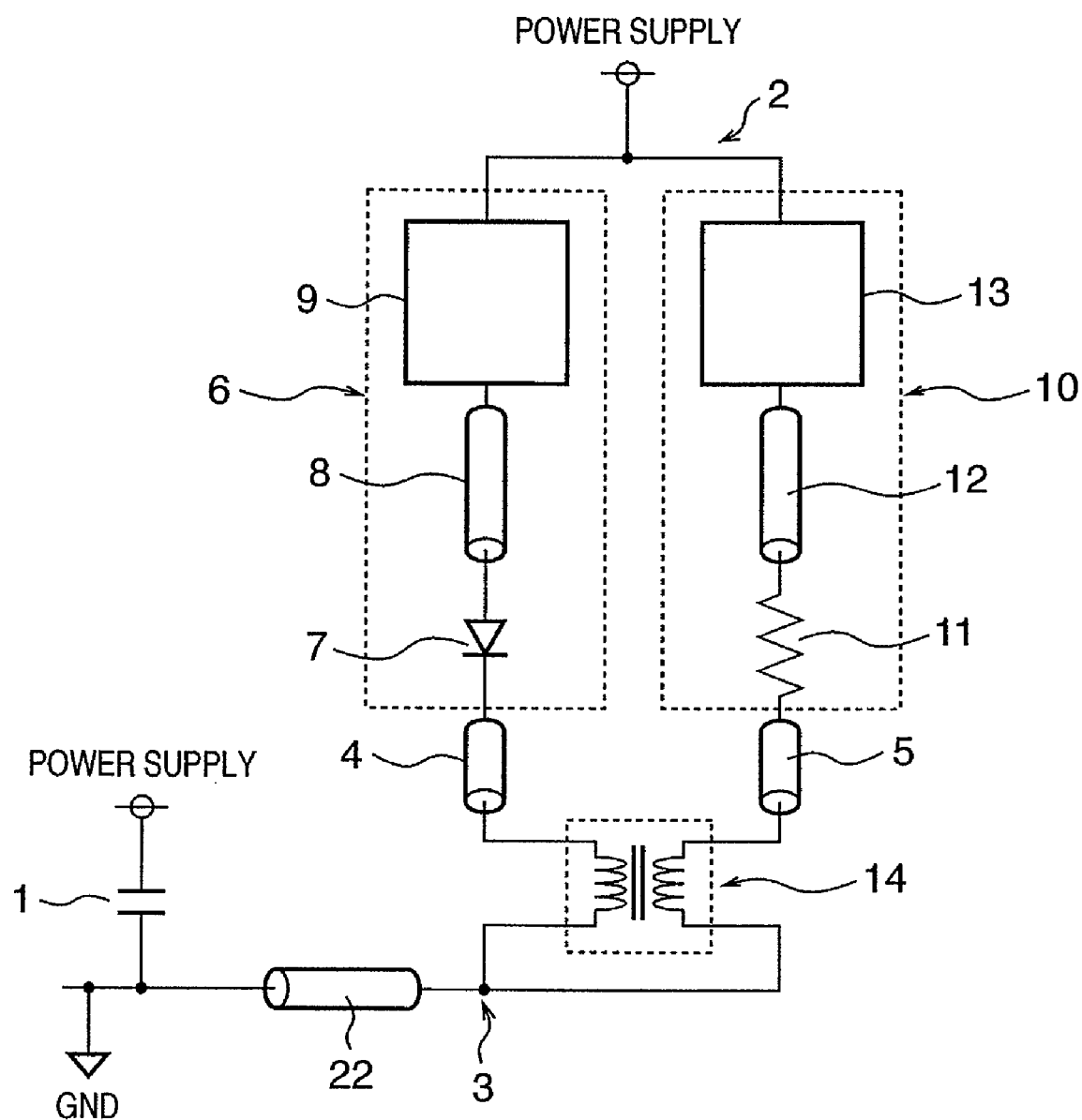
FIG. 11 is a circuit diagram showing a laser driving circuit according to the second embodiment.

FIG. 11 shows a laser driving circuit according to the second embodiment of the present invention. In the first embodiment, the common mode choke coil 14 is interposed between the light-emitting circuit 6, the compensation circuit 10, and the main power transmission wiring 2. In the second embodiment, a common mode choke coil 14 is interposed between a light-emitting circuit 6, a compensation circuit 10, and a main GND wiring 22. In FIG. 11, the same reference numerals as those in FIG. 1 denote the same members.

Also in FIG. 11, the common mode choke coil 14 can selectively remove only in-phase components from currents flowing from the main GND wiring 22 to the light-emitting circuit 6 and compensation circuit 10. A noise component such as ringing is suppressed, and increases in speed and image quality and reduction of radiation noise are simultaneously achieved.

Further, the second embodiment can reduce even radiation noise from a surrounding metal housing functioning as an antenna. When a main wiring 2 is a GND wiring, a noise current flowing through the main wiring 2 flows into the surrounding metal housing via a metal spacer which connects the board GND and surrounding metal housing. The surrounding metal housing also functions as an antenna in addition to the above-described power cable, increasing radiation noise. However, the second embodiment enhances the compensation function, and can suppress a noise current itself flowing through the main wiring 2. Thus, radiation noise from the surrounding metal housing functioning as an antenna can also be reduced in addition to radiation noise from the power cable functioning as an antenna.

As has been described above, when the above embodiments are applied to a semiconductor laser driving printed circuit board in a laser beam printer or the like, demands for higher printing speeds and higher image qualities of printed images can be satisfied, and radiation noise can be reduced.

The present invention is not limited to the above embodiments and various changes and modifications can be made within the spirit and scope of the present invention. Therefore, to apprise the public of the scope of the present invention the following claims are made.

This application claims the benefit of Japanese Applications No. 2005-161416, filed Jun. 1, 2005 and No. 2006-142163, filed May 22, 2006, which are hereby incorporated by reference herein in their entirety.

The invention claimed is:

1. A laser driving circuit comprising:
    a first wiring pattern and a second wiring pattern which are connected to a main wiring pattern;
    a first circuit which is connected to said first wiring pattern and has a semiconductor laser element and a laser driving device for driving the semiconductor laser element;
    a second circuit which is connected to said second wiring pattern and has a compensation element and a compensation driving device; and
    an impedance control unit, connected to said first wiring pattern and said second wiring pattern, for selectively increasing impedances to in-phase signal components in a signal flowing through said first wiring pattern and said first circuit and a signal flowing through said second wiring pattern and said second circuit,
    wherein the first circuit is a light-emitting circuit which causes the semiconductor laser element to emit light, said second circuit is a compensation circuit having the same electrical characteristics as an electrical characteristic of the light-emitting circuit, and the laser driving device and the compensation driving device are complementarily driven.

2. The laser driving circuit according to claim 1, wherein said impedance control unit is a common mode choke coil.

3. The laser driving circuit according to claim 1, characterized wherein the main wiring pattern is a main power transmission pattern.

4. The laser driving circuit according to claim 1, wherein the main wiring pattern is a main ground pattern.

* * * * *